(12) United States Patent
Kamoshima et al.

(10) Patent No.: US 6,214,723 B1
(45) Date of Patent: Apr. 10, 2001

(54) METHOD OF MANUFACTURING A SEMICONDUCTOR DEVICE

(75) Inventors: Takao Kamoshima; Hiroki Takewaka; Takashi Yamashita, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/391,388

(22) Filed: Sep. 8, 1999

(30) Foreign Application Priority Data

Apr. 30, 1999 (JP) ................................................. 11-124002

(51) Int. Cl.⁷ ...................................................... H01L 21/44
(52) U.S. Cl. .......................... 438/653; 438/688; 438/978
(58) Field of Search .................................... 438/688, 653, 438/978; 257/765

(56) References Cited

U.S. PATENT DOCUMENTS 5,270,255 * 12/1993 Wong ..................................... 438/688
5,459,353 * 10/1995 Kanazawa ............................. 257/751
5,523,259 * 6/1996 Merchant et al. .................... 438/688
5,572,072 * 11/1996 Lee ....................................... 257/751
5,844,318 * 12/1998 Sandhu et al. ....................... 257/774

FOREIGN PATENT DOCUMENTS 4-315427   11/1992  (JP).

* cited by examiner

Primary Examiner—T. N. Quach
(74) Attorney, Agent, or Firm—McDermott, Will & Emery (57) ABSTRACT

A method of manufacturing a semiconductor device with high reliability is provided in which an insulating property of an insulating layer is high and connection failure is prevented. The semiconductor device includes: a silicon substrate; a low-temperature aluminum film formed on silicon substrate and including a polycrystal; and a high-temperature aluminum film. An opening is formed in a surface of a high-temperature aluminum film by a crystal grain boundary. A distance between side walls of the opening becomes small as closer to silicon substrate.

9 Claims, 12 Drawing Sheets

METHOD OF MANUFACTURING A SEMICONDUCTOR DEVICE

BACKGROUND OF THE INVENTION

1. Field of the Invention

The present invention relates to semiconductor devices and manufacturing methods thereof, and more particularly to a semiconductor device having a conductive layer as an interconnection layer and a manufacturing method thereof.

2. Description of the Background Art

Conventionally, aluminum is used for an interconnection layer of a semiconductor device. The problem related to a method of manufacturing the interconnection with aluminum will be described.

FIGS. 18 to 22 are cross sectional views shown in conjunction with the problem associated with the conventional manufacturing method.

Figure 18:
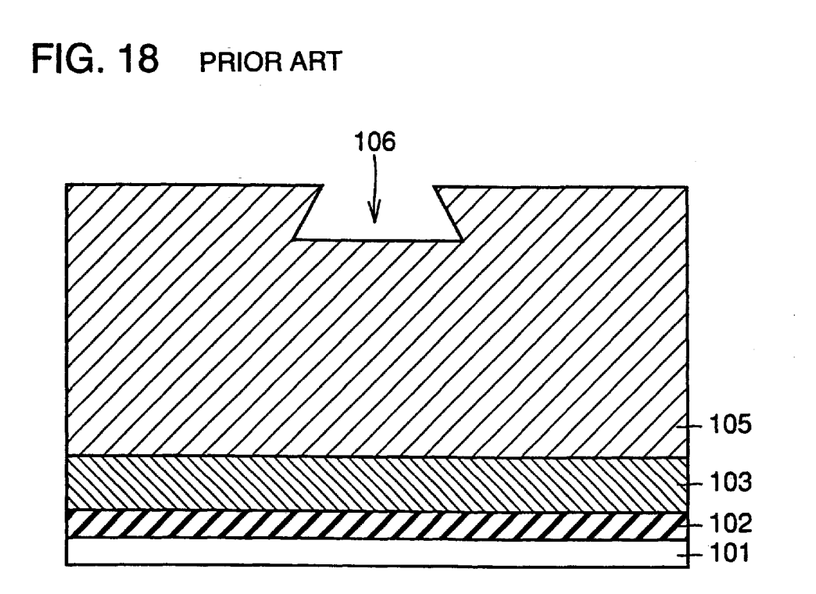
FIGS. 18 to 22 are cross sectional views showing first to fifth steps of a method of manufacturing a conventional semiconductor device.

Referring to FIG. 18, an interlayer insulating film 102 is formed on a silicon substrate 101. A titanium nitride film 103 as a barrier layer is formed on interlayer insulating film 102. An aluminum film (hereinafter referred to as a high-temperature aluminum film) 105 is formed on titanium nitride film 103 by sputtering at a high temperature of about 400° C.

The formation of the aluminum film at such high temperature increases planarity of high-temperature aluminum film 105. A crystal grain size of high-temperature aluminum film 105 is larger than that of an aluminum film formed at a low temperature. Therefore, when high-temperature aluminum film 105 is cooled, a recess 106 is formed by the grain boundary, for example, due to shrinkage of a crystal.

Figure 19:
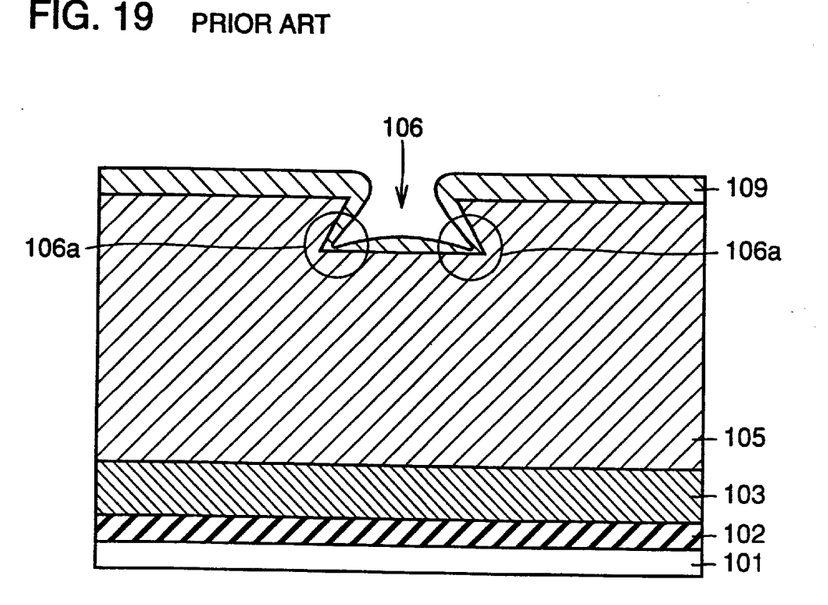

Referring to FIG. 19, an anti-reflection film 109 of titanium nitride is formed on a surface of high-temperature aluminum film 105. At the time, a thickness of anti-reflection film 109 is particularly small at a corner 106a of recess 106.

Figure 20:
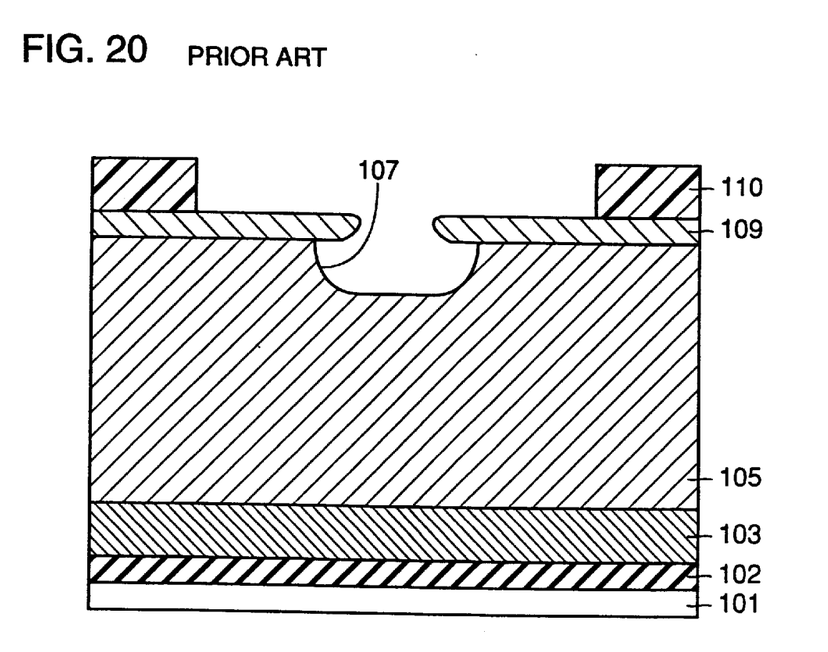

Referring to FIG. 20, resist is applied onto anti-reflection film 109. After the resist is exposed to light, a resist pattern 110 is formed by development using developer. As the thickness of anti-reflection film 109 is small at corner 106a of recess 106, the developer melts a portion of anti-reflection film 109 and also a portion of high-temperature aluminum film 105. Thus, recess 106 extends and an opening 107 is formed. Opening 107 is greater than the opening at anti-reflection film 109.

Figure 21:
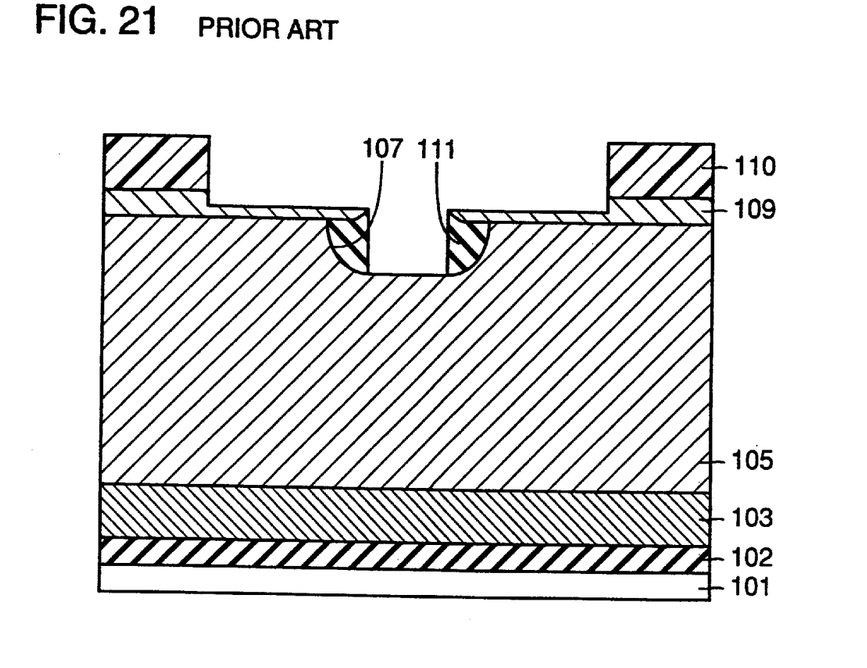

Referring to FIG. 21, etching of anti-reflection film 109 and high-temperature aluminum film 105 is started using resist pattern 110 as a mask. At the time, etch residue 111, formed by reaction of high-temperature aluminum film 105 and etchant, is left at a portion covered by anti-reflection film 109 in opening 107. It is relatively difficult to etch etching residue 111.

Figure 22:
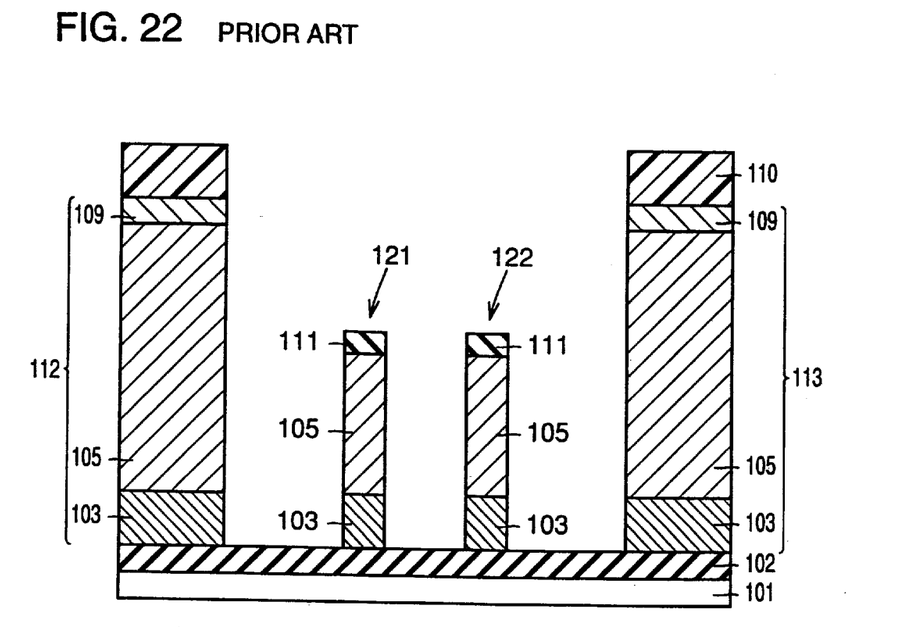

Referring to FIG. 22, when etching is further performed, etch residue 111 acts as a mask to leave high-temperature aluminum film 105 and titanium nitride film 103 thereunder. As a result, interconnection layers 112 and 113 are formed and, at the same time, residues 121 and 122 including conductive portions are formed at portions which would have essentially been free of such conductive materials.

Formation of an interlayer insulating film on residues 121 and 122 would result in insulation failure of the interlayer insulating film and reduction in reliability of the semiconductor device.

SUMMARY OF THE INVENTION

The present invention is made to solve the aforementioned problem. An object according to one aspect of the present invention is to provide a semiconductor device provided with high reliability and preventing insulation failure.

An object according to another aspect of the present invention is to provide a semiconductor device provided with high adhesion with a lower layer and preventing connection failure.

The semiconductor device according to one aspect of the present invention includes a semiconductor substrate and a conductive layer including polycrystal formed on the semiconductor substrate. A recess is formed by a grain boundary in a surface of the conductive layer. A distance between side walls of the recess becomes small as closer to the semiconductor substrate.

In the semiconductor device having such structure, as the distance between the side walls of the recess becomes small as closer to the semiconductor substrate, there would be no space for the residue caused by the etching in the recess in the conductive layer and any conductive material is not left at the unexpected portion. As a result, the semiconductor device provided with high reliability and preventing insulation failure is provided.

More preferably, the conductive layer includes first and second conductive layers. The first conductive layer is formed on the semiconductor substrate and includes a polycrystal having a first average grain size. The second conductive layer is formed with a recess on the first conductive layer and includes a polycrystal having a second average grain size which is greater than the first average grain size.

As the first average grain size is relatively small as compared with the second average grain size, adhesion between the first conductive layer of the first average grain size and a lower layer increases. Thus, the semiconductor device provided with high reliability and preventing connection failure is provided.

More preferably, the semiconductor device further includes a thin film layer formed on the conductive layer and having a material which is different from that of the conductive layer.

More preferably, the thin film layer includes titanium or silicon nitride. Then, the thin film layer can be used as a barrier layer or anti-reflection layer.

More preferably, the conductive layer includes aluminum.

More preferably, the semiconductor device further includes an insulating layer formed on the semiconductor substrate and a barrier layer formed on the insulating layer. The conductive layer is formed on the barrier layer.

Then, as the barrier layer is formed under the conductive layer, diffusion of atoms of the conductive layer can be prevented.

A semiconductor device according to another aspect of the present invention includes first, second and third conductive layers. The first conductive layer is formed on the semiconductor substrate and includes a polycrystal having a first average grain size. The second conductive layer is formed on the first conductive layer and includes a polycrystal having a second average grain size which is greater than the first average grain size. The third conductive layer is formed on the second conductive layer and includes a polycrystal having a third average grain size which is smaller than the second average grain size.

In the semiconductor device having such structure, as the average grain size of the third conductive layer formed on the second conductive layer is small, formation of a recess by a grain boundary in the third conductive layer is prevented. As there would be no space for residue caused by etching in the third conductive layer, a conductive material is not left at an unexpected portion. As a result, the semiconductor device provided with high reliability and preventing insulation failure is provided.

As a first average grain size of the first conductive layer formed on the semiconductor substrate is relatively small, adhesion with a lower layer is increased and connection failure can be prevented.

More preferably, a recess is formed in a surface of the second conductive layer by the grain boundary. A distance between side walls of the recess becomes small as closer to the semiconductor substrate.

Then, there would be no space for the residue caused by the etching in the third conductive layer covering the recess. As a result, the conductive material is not left at the unexpected portion, so that reliability of the semiconductor device is further increased.

More preferably, the semiconductor device further includes a thin film layer formed on the third conductive layer and having a material which is different from that of the third conductive layer.

More preferably, the thin film layer includes titanium or silicon nitride. Then, the thin film layer can be used as an anti-reflection film or barrier layer.

More preferably, the conductive layer includes aluminum.

More preferably, the semiconductor device includes an insulating layer formed on the semiconductor substrate and a barrier layer formed on the insulating layer. The conductive layer is formed on the barrier layer.

Then, as the barrier layer is formed under the conductive layer, diffusion of atoms of the conductive layer can be prevented.

A method of manufacturing a semiconductor device according to one aspect of the present invention includes a step of forming a conductive layer including a polycrystal on a semiconductor substrate. The conductive layer having a recess in its surface formed by a grain boundary. A distance between side walls of the recess becomes large as closer to the semiconductor substrate. The method of manufacturing the semiconductor device includes a step of forming the side walls such that a distance therebetween becomes small as closer to the semiconductor substrate.

In the method of manufacturing the semiconductor device having such structure, the side walls prevents formation of a space for the residue in the conductive layer. Thus, a conductive material is not left at an unexpected portion, so that the semiconductor device provided with high reliability and preventing insulation failure is provided.

More preferably, the step of forming the conductive layer includes a step of forming a first conductive layer at a first temperature on the semiconductor substrate, and a step of forming a second conductive layer having a recess at a second temperature which is higher than the first temperature on the first conductive layer.

As the first conductive layer is formed at the relatively low temperature, adhesion between the first conductive layer and a lower layer increases. As a result, the semiconductor device provided with high reliability and preventing connection failure is provided.

More preferably, the step of forming the second conductive layer includes a step of keeping the second conductive layer in the atmosphere at the second temperature after the second conductive layer is formed by sputtering at a temperature which is lower than the second temperature.

More preferably, the method of manufacturing the semiconductor device further includes a step of forming a thin film layer having a material which is different from that of the conductive layer on the conductive layer having the formed side walls.

More preferably, the method of manufacturing the semiconductor device further includes a step of forming an insulating layer on the semiconductor substrate and a step of forming a barrier layer on the insulating layer. The step of forming the conductive layer includes a step of forming a conductive layer on the barrier layer.

Then, as the barrier layer is formed under the conductive layer, diffusion of atoms of the conductive layer is prevented.

More preferably, the step of forming the side walls includes a step of sputter etching the conductive layer.

A method of manufacturing a semiconductor device according to another aspect of the present invention includes a step of forming a first conductive layer on a semiconductor substrate at a first temperature, a step of forming a second conductive layer on the first conductive layer at a second temperature higher than the first temperature, and a step of forming a third conductive layer on the second conductive layer at a third temperature lower than the second temperature.

In the method of manufacturing the semiconductor device having such structure, as the third conductive layer is formed at the relatively low temperature, formation of a recess in a surface of the third conductive layer by a grain boundary is prevented. Thus, there would be no space for a residue caused by the etching in the surface of the third conductive layer. As a result, any conductive material is not left at an unexpected portion, so that the semiconductor device provided with high reliability and preventing insulation failure is provided.

As the first conductive layer is formed at the relatively low temperature, adhesion with a lower layer increases. Thus, the semiconductor device provided with high reliability and preventing connection failure is provided.

Preferably, the step of forming the second conductive layer includes a step of forming a second conductive layer having in its surface a recess caused by the grain boundary, where a distance between side walls of the recess becomes large as closer to the semiconductor substrate. The method of manufacturing the semiconductor device further includes a step of forming the side walls such that the distance therebetween becomes small as closer to the semiconductor substrate. The step of forming the third conductive layer includes a step of forming the third conductive layer on the second conductive layer having the formed side walls.

As the side walls of the recess are thus formed, even when the third conductive layer is formed thereon, there would be no space for the residue caused by the etching in the third conductive layer. As a result, any conductive material is not left at the unexpected portion, so that the semiconductor device provided with higher reliability and preventing insulating failure is provided.

More preferably, the step of forming the side walls includes a step of sputter etching the conductive layer.

More preferably, the method of manufacturing the semiconductor device further includes a step of forming a thin film layer having a material which is different from that of the third conductive layer on the third conductive layer.

The step of forming the second conductive layer includes a step of keeping the second conductive layer in the atmosphere at the second temperature after the second conductive layer is formed by sputtering at a temperature lower than the second temperature.

More preferably, the method of manufacturing the semiconductor device further includes a step of forming an insulating layer on the semiconductor substrate and a step of forming a barrier layer on the insulating layer. The step of forming the conductive layer includes a step of forming a conductive layer on the barrier layer. Then, as the conductive layer is formed on the barrier layer, diffusion of atoms of the conductive layer is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

First Embodiment

Figure 1A:
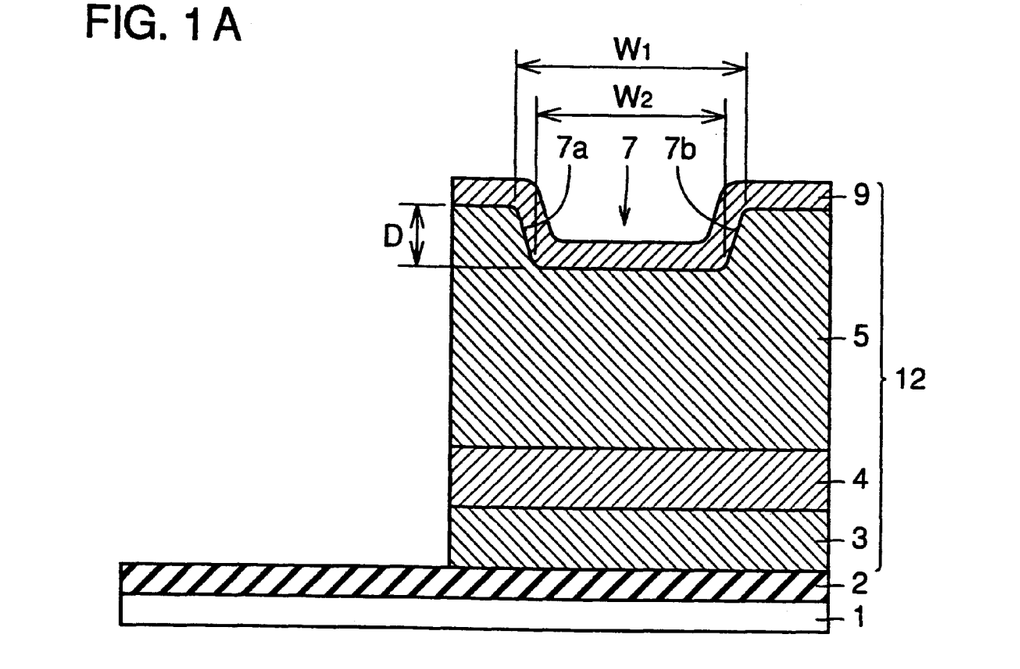
FIG. 1A is a schematic cross sectional view showing a semiconductor device according to a first embodiment of the present invention.

Referring to FIG. 1A, in a semiconductor device according to the present invention, an interlayer insulating film 2 is formed on a silicon substrate 1 as a semiconductor substrate. An interconnection layer 12 is formed on interlayer insulating film 2. Interconnection layer 12 includes: a titanium nitride film 3 as a barrier layer; a low-temperature aluminum layer (an aluminum layer formed at a low temperature) 4 as a first conductive layer; a high-temperature aluminum layer 5 as a second conductive layer; and an anti-reflection film 9 as a thin film layer having two layers of titanium and titanium nitride.

Titanium nitride film 3 has a thickness of about 100 nm. A thickness of low-temperature aluminum film 4 including polycrystalline aluminum is about 150 nm and has an average crystal grain size of about 0.5 $\mu$m. High-temperature aluminum film 5 is formed on low-temperature aluminum film 4. A thickness of high-temperature aluminum film is about 200 nm. High-temperature aluminum film 5 includes polycrystalline aluminum and has an average crystal grain size of about 1.5 $\mu$m. An opening 107 is formed as a recess in a surface of high-temperature aluminum film 5.

Figure 1B:
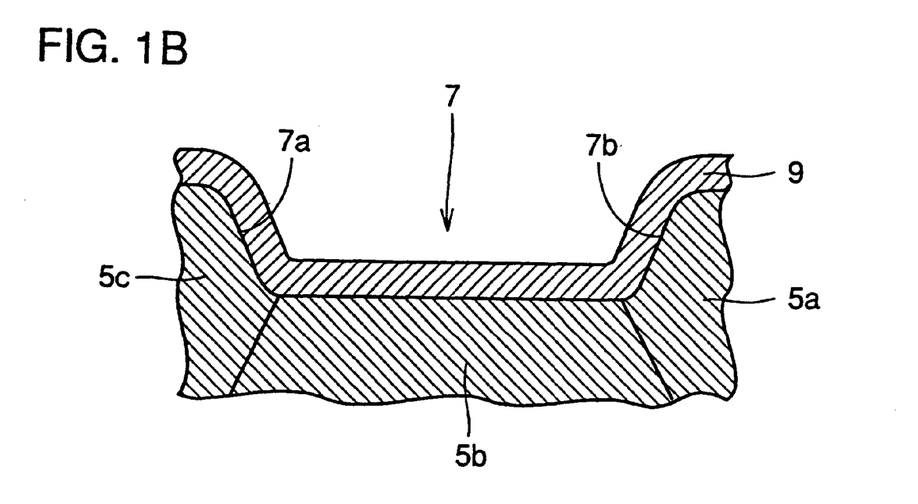
FIG. 1B is a partial cross sectional view showing in enlargement an opening in the semiconductor device according to the first embodiment of the present invention.

Referring to FIG. 1B, opening 7 is defined by grain boundaries of crystals 5a to 5c of aluminum. Opening 7 has a depth D of 20 nm, a diameter $W_1$ at its upper portion of about 50 nm and a diameter $W_2$ at its bottom portion of 30 nm. A distance between side walls 7a and 7b of opening 7 becomes small as closer to silicon substrate 1.

Figure 2:
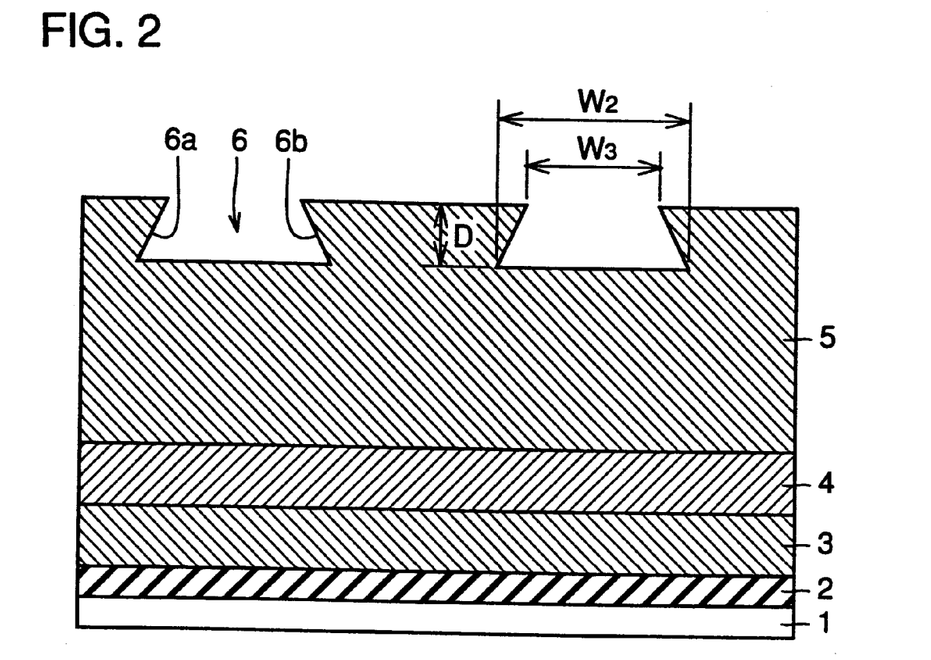
FIG. 2 is a cross sectional view showing a first step of a method of manufacturing the semiconductor device shown in FIG. 1.

Now, a method of manufacturing the semiconductor device shown in FIG. 1 will be described. Referring to FIG. 2, an interlayer insulating film 2 is formed by CVD (Chemical Vapor Deposition) on a surface of silicon substrate 1. A titanium nitride film 3 is formed on interlayer insulating film 2 by PVD (Physical Vapor Deposition).

A low-temperature aluminum film 4 is formed on titanium nitride film 3 by sputtering at a low temperature of about 100° C. High-temperature aluminum film 5 is formed on low-temperature aluminum film 4 by sputtering at a high temperature of about 400° C. Thereafter, high-temperature aluminum film 5 is cooled, and a recess 6 is formed in a surface thereof by crystal depression.

Figure 3:
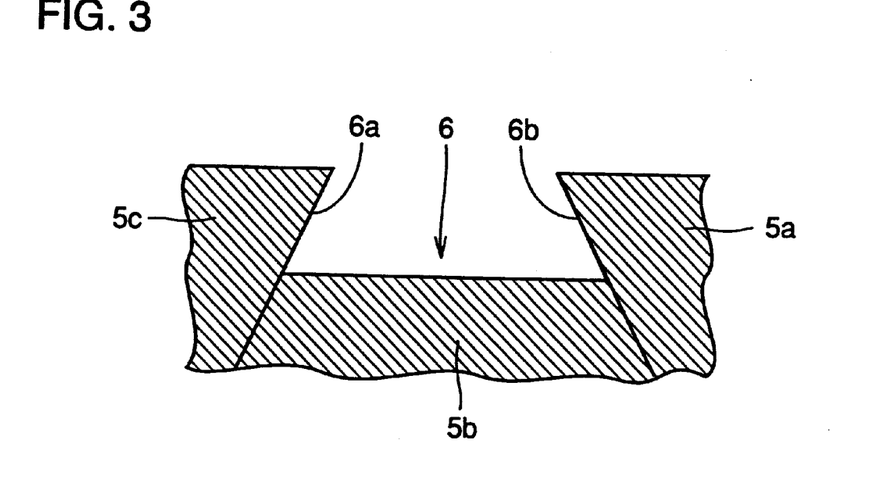
FIG. 3 is a partial cross sectional view showing in enlargement a recess of the semiconductor device shown in FIG. 2.

Referring to FIG. 3, recess 6 is formed by grain boundaries of crystals 5a to 5c of aluminum, that is, crystal grain boundaries of aluminum. Recess 6 is formed by depression of crystal 5b of aluminum.

Returning to FIG. 2, the largest portion of recess 6 has a diameter $W_2$, and a diameter at the surface of high-temperature aluminum film 5 is $W_3$ (20 nm). A distance between side walls 6a and 6b of recess 6 becomes small as closer to silicon substrate 1.

Figure 4:
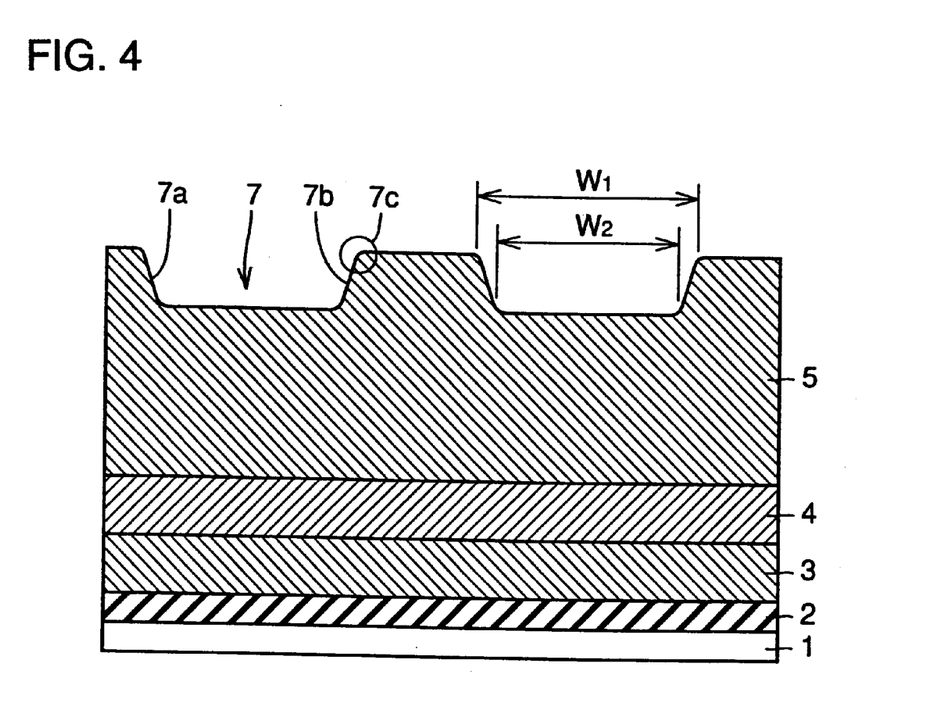
FIGS. 4 to 7 are cross sectional views showing second to fifth steps of the method of manufacturing the semiconductor device shown in FIG. 1.

Referring to FIG. 4, the surface of high-temperature aluminum film 5 is sputter etched using argon gas. Thus, opening 7 is formed by processing the side walls of recess 6. A distance between side walls 7a and 7b of opening 7 becomes small as closer to silicon substrate 1. A corner 7c of opening 7 is arcuate in shape.

Figure 5:
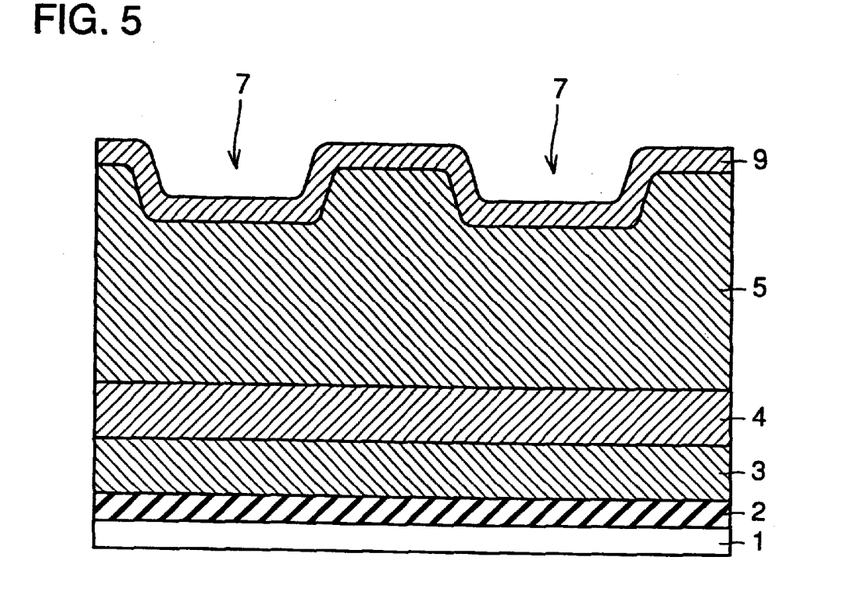

Referring to FIG. 5, an anti-reflection film 9 having two layers of titanium and titanium nitride is formed by PVD to cover high-temperature aluminum film 5.

Figure 6:
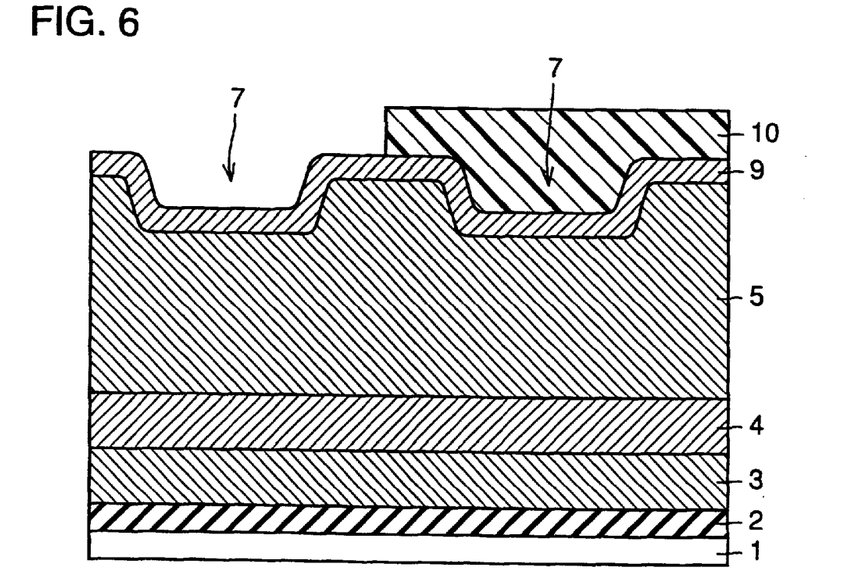

Referring to FIG. 6, resist is applied onto anti-reflection film 9. After the resist is exposed to light, it is developed by developer to form a resist pattern 10.

Figure 7:
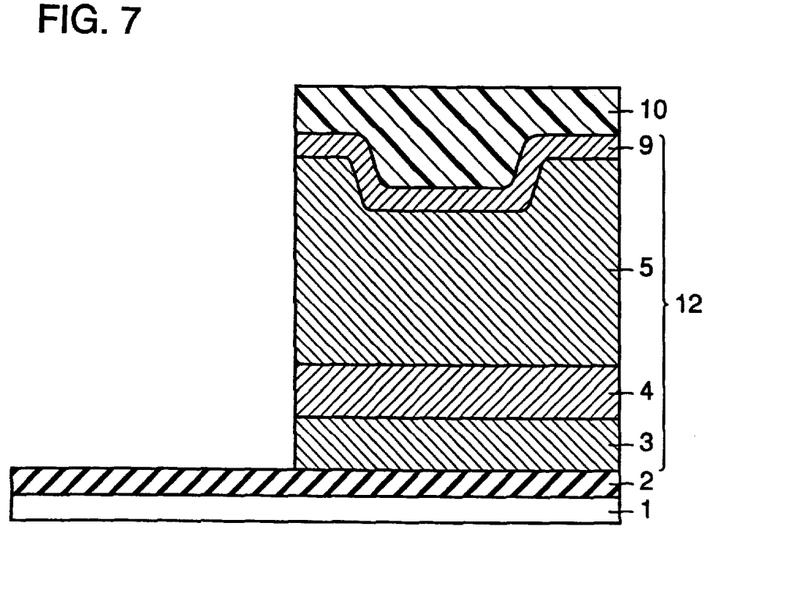

Referring to FIG. 7, anti-reflection film 9, high-temperature aluminum film 5, low-temperature aluminum film 4 and titanium nitride film 3 are etched in accordance with resist pattern 10. Thus, an interconnection layer 12 is formed. Thereafter, resist pattern 10 is removed to complete the semiconductor device shown in FIG. 1.

According to the semiconductor device and manufacturing method thereof, first, side walls 7a and 7b of opening 7 are formed as shown in FIG. 4. As anti-reflection film 9 is formed over opening 7, any particular portion of anti-reflection film 9 would not have extremely small thickness. Thus, if the resist is developed in the step shown in FIG. 6, formation of a space for etch residue is prevented. As a result, etching in accordance with resist pattern 10 ensures that a conductive material is left exclusively under resist pattern 10 and the other portion would be free of the conductive material. Therefore, the semiconductor device is provided with higher reliability.

Low-temperature aluminum film 4 is formed on titanium nitride film 3. As low-temperature aluminum film 4 is provided with high adhesion with other layers, the semiconductor device provided with high reliability and preventing connection failure is achieved.

Second Embodiment

Figure 8:
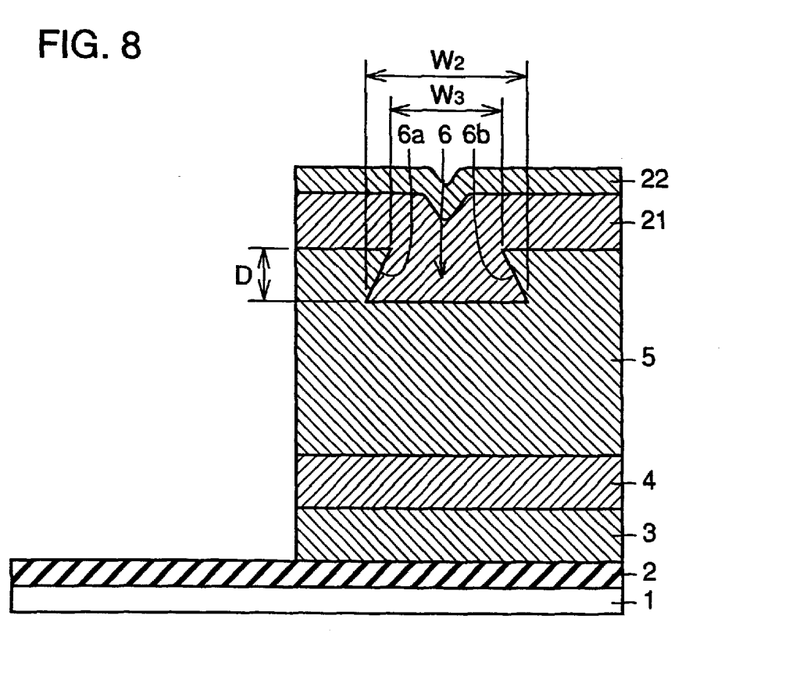
FIG. 8 is a cross sectional view showing a semiconductor device according to a second embodiment of the present invention.

Referring to FIG. 8, silicon substrate 1, interlayer insulating film 2, titanium nitride film 3 and low-temperature aluminum film 4 are the same as those of the first embodiment.

A high-temperature aluminum-film 5 is formed on low-temperature aluminum film 4. High-temperature aluminum film 5 has an average grain size of 1.5 μm and a thickness of 200 nm. A recess 6 is formed in a surface of high-temperature aluminum film 5. A dimension of recess 6 is the same as that shown in FIG. 2.

Low-temperature aluminum film 21 is formed over recess 6. Low-temperature aluminum film 21 has a thickness of 100 nm and an average grain size of 0.1 μm. A distance between side walls 6a and 6b of recess 6 becomes small as closer to silicon substrate 1. An anti-reflection film 22 having two layers of titanium and titanium nitride is formed on low-temperature aluminum film 21.

Figure 9:
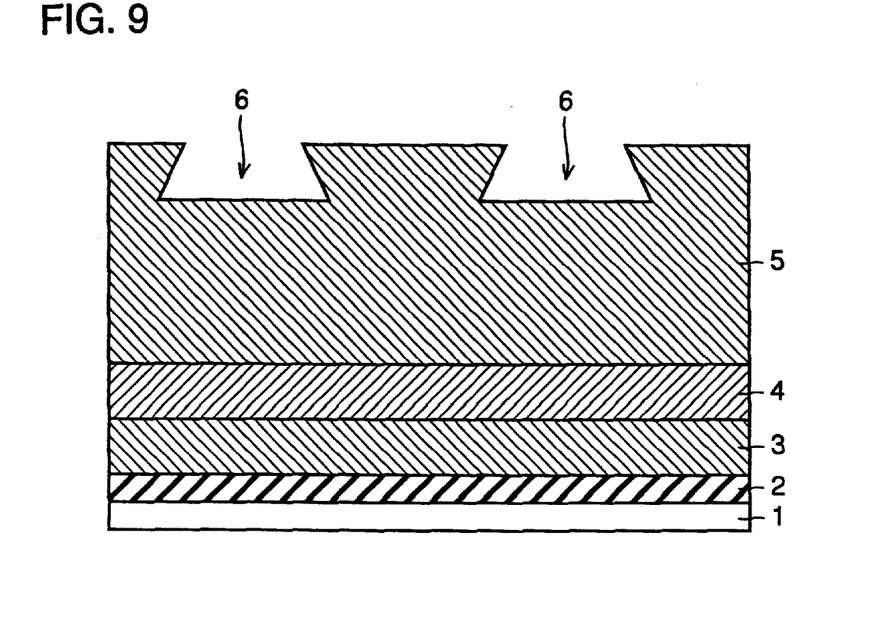
FIGS. 9 to 12 are cross sectional views showing first to fourth steps of a method of manufacturing the semiconductor device shown in FIG. 8.

Now, a method of manufacturing the semiconductor device shown in FIG. 8 will be described. Referring to FIG. 9, as in the first embodiment, an interlayer insulating film 2, titanium nitride film 3, low-temperature aluminum film 4 and high-temperature aluminum film 5 are formed on silicon substrate 1. Recess 6 is formed in the surface of high-temperature aluminum film 5.

Figure 10:
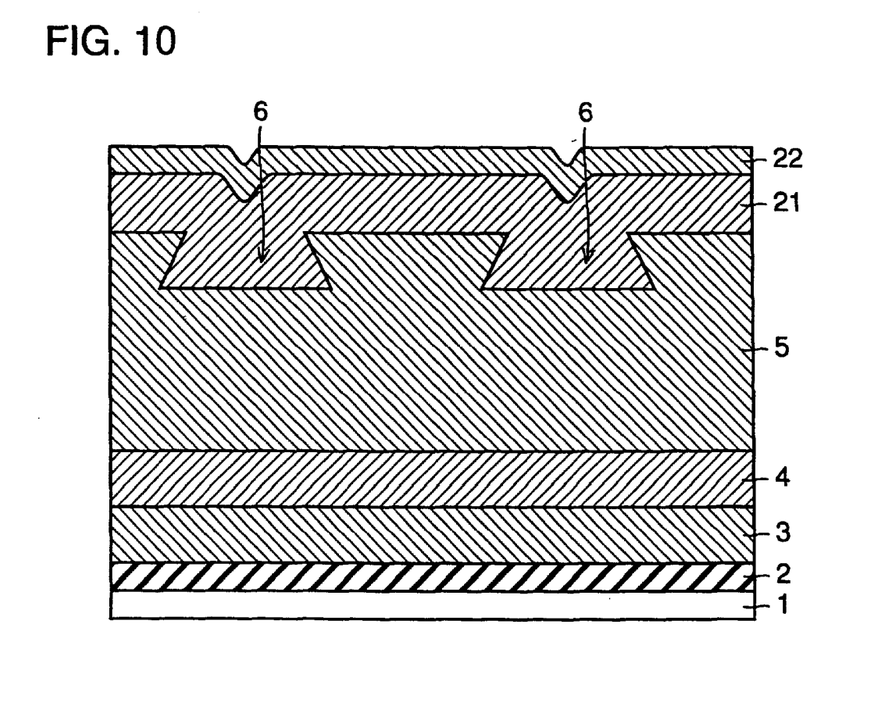

Referring to FIG. 10, low-temperature aluminum film 21 is formed by sputtering at a temperature of about 100° C. An anti-reflection film 22 is formed on low-temperature aluminum film 21 by PVD.

Figure 11:
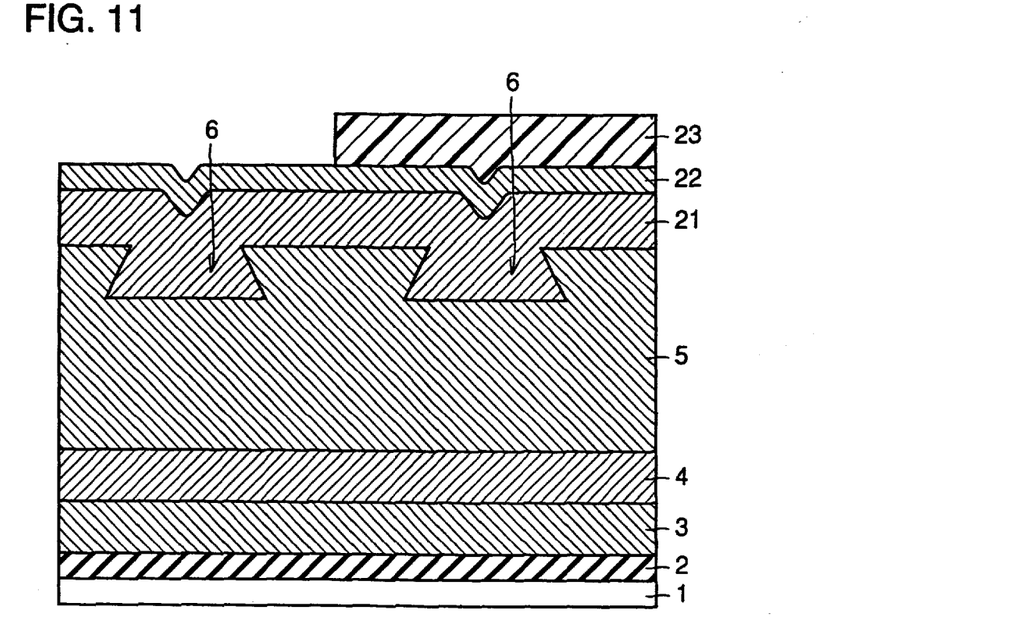

Referring to FIG. 11, resist is applied onto anti-reflection film 22. After the resist is exposed to light, it is developed by a developer to form a resist pattern 23.

Figure 12:
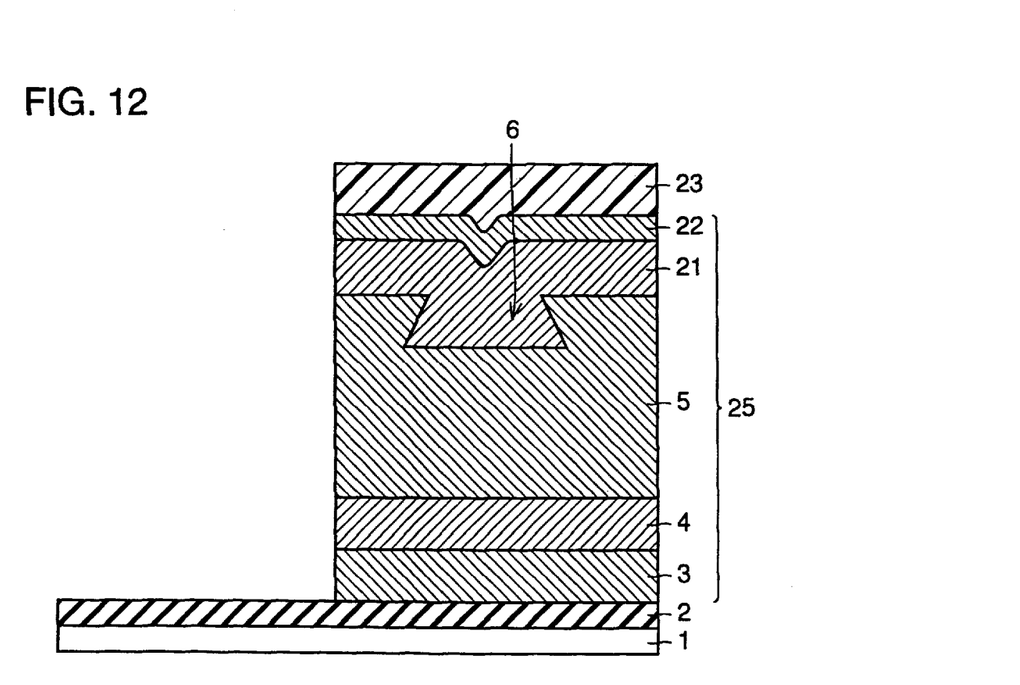

Referring to FIG. 12, anti-reflection film 22, low-temperature aluminum film 21, high-temperature aluminum film 5, low-temperature aluminum film 4 and titanium nitride film 3 are etched in accordance with resist pattern 23. Thus, an interconnection layer 25 is formed. Thereafter, resist pattern 23 is removed to complete the semiconductor device shown in FIG. 8.

According to the semiconductor device and manufacturing method thereof, low-temperature aluminum film 21 is formed in recess 6. As the average grain size of low-temperature aluminum film 21 is relatively small, it is unlikely that depression of a crystal is caused. Thus, even when anti-reflection film 22 is formed on low-temperature aluminum film 21, any portion of anti-reflection film 22 would not have a smaller thickness. Therefore, low-temperature aluminum film 21 would not be etched at the time of development of resist pattern 23, and there is not any space for the etch residue. In addition, insulation failure is prevented. As shown in FIG. 12, the conductive material is left exclusively under resist pattern 23, and the other portion would be free of conductive material. As a result, the semiconductor device with high reliability is achieved.

Low-temperature aluminum film 4 is formed on titanium nitride film 3. As low-temperature aluminum film 4 has high adhesion with other layers, connection failure is prevented. As a result, the semiconductor device with high reliability is achieved.

Third Embodiment

Figure 13:
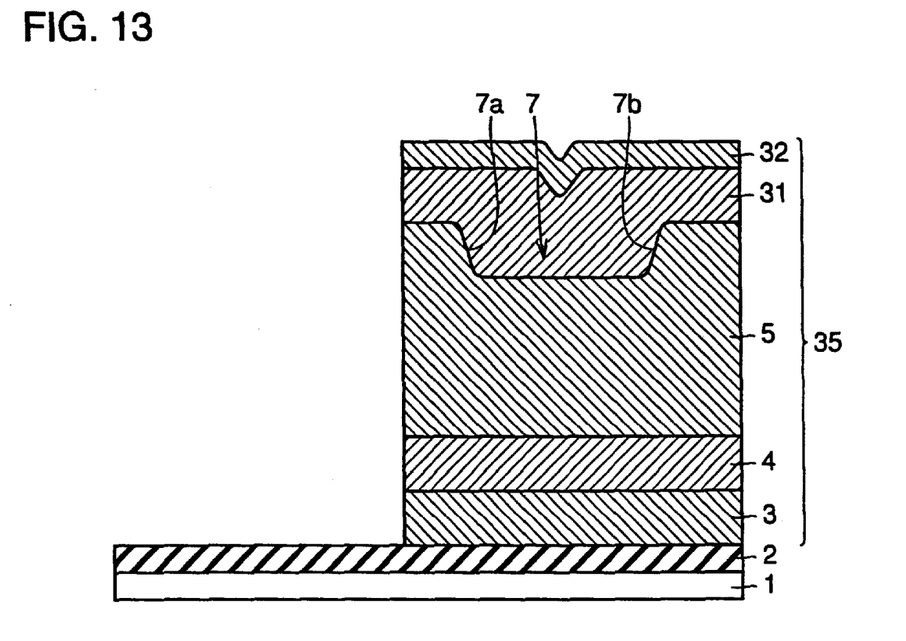
FIG. 13 is a cross sectional view showing a semiconductor device according to a third embodiment of the present invention.

Referring to FIG. 13, an interlayer insulating film 2, titanium nitride film 3, low-temperature aluminum film 4 and high-temperature aluminum film 5 are formed on a silicon substrate 1. An opening 7 is formed in a surface of high-temperature aluminum film 5, and a distance between side walls 7a and 7b of opening 7 becomes small at closer to silicon substrate 1. Low-temperature aluminum film 31 is formed in opening 7.

An anti-reflection film 32 having two layers of titanium and titanium nitride is formed on low-temperature aluminum film 31. Titanium nitride film 3, low-temperature aluminum film 4, high-temperature aluminum film 5, low-temperature aluminum film 31 and anti-reflection film 32 comprise an interconnection layer 35.

Figure 14:
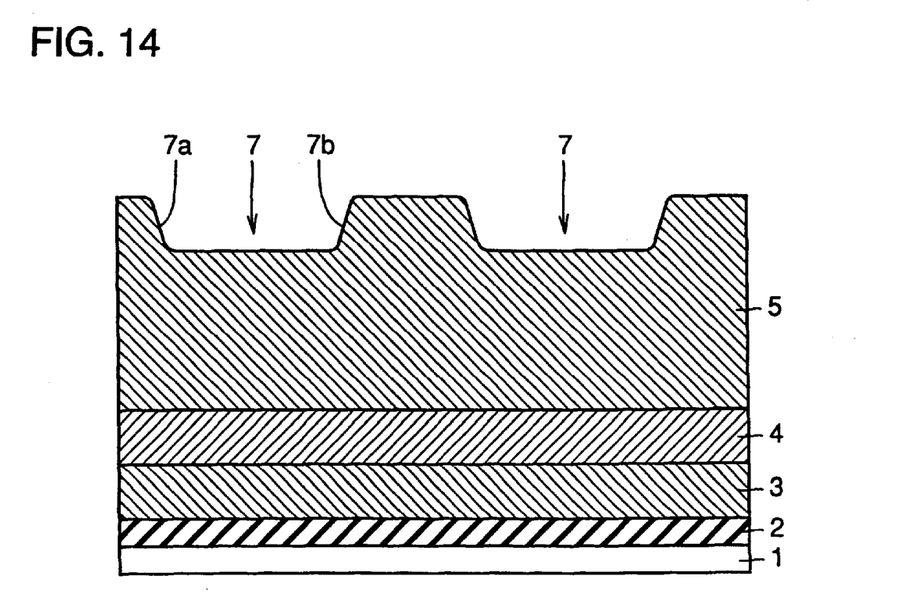
FIGS. 14 to 17 are cross sectional views showing first to fourth steps of a method of manufacturing the semiconductor device shown in FIG. 13.

Now, a method of manufacturing the semiconductor device shown in FIG. 13 will be described. Referring to FIG. 14, as in the steps shown in FIGS. 2 and 4 of the first embodiment, interlayer insulating film 2, titanium nitride film 3, low-temperature aluminum film 4 and high-temperature aluminum film 5 are formed on silicon substrate 1. Opening 7 is formed by sputter etching the surface of high-temperature aluminum film 5 by argon. The distance between side walls 7a and 7b of opening 7 becomes small as closer to silicon substrate 1.

Figure 15:
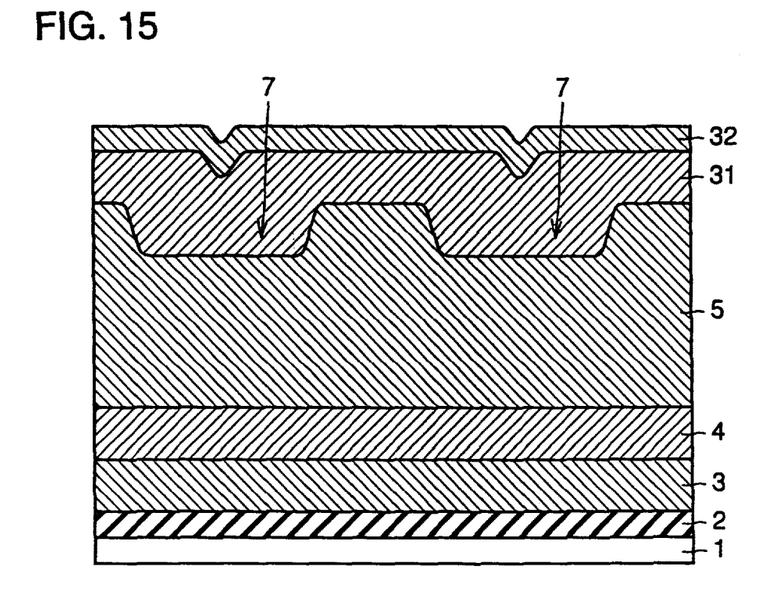

Referring to FIG. 15, low-temperature aluminum film 31 is formed to cover opening 7 by sputtering at a temperature of about 100° C. Anti-reflection film 32 having two layers of titanium and titanium nitride is formed on low-temperature aluminum film 31 by CVD.

Figure 16:
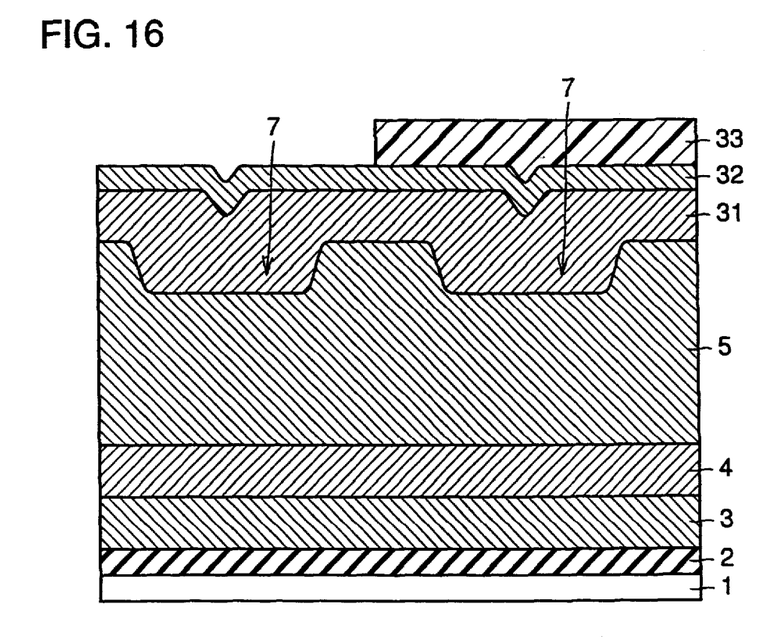

Referring to FIG. 16, resist is applied onto anti-reflection film 32. After the resist is exposed to light, it is developed by developer. Thus, a resist pattern 33 is formed.

Figure 17:
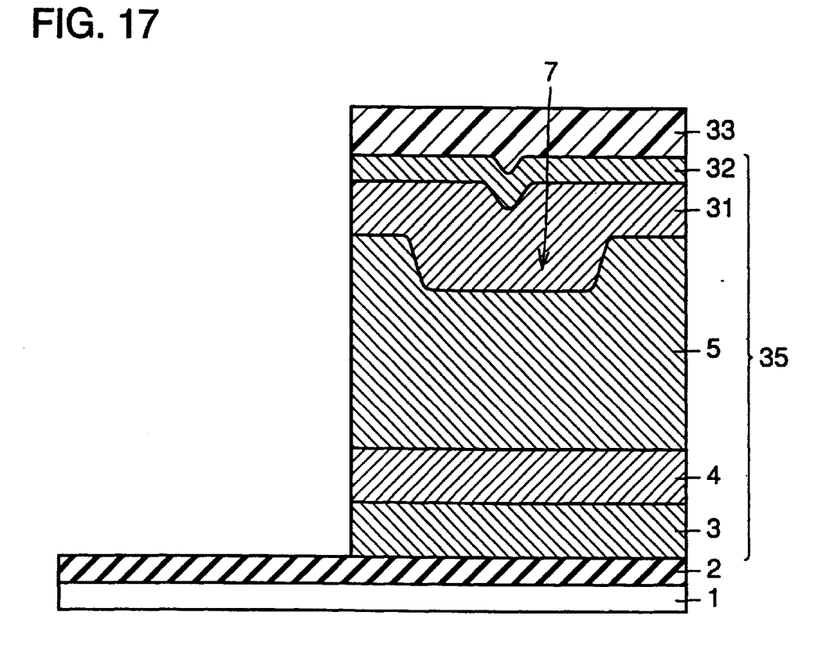

Referring to FIG. 17, anti-reflection film 32, low-temperature aluminum film 31, high-temperature aluminum film 5, low-temperature aluminum film 4 and titanium nitride film 3 are etched in accordance with resist pattern 33 to form an interconnection layer 35. Thereafter, resist pattern 33 is removed to complete the semiconductor device shown in FIG. 13.

According to the semiconductor device and manufacturing method thereof, first, low-temperature aluminum film 31 is formed on high-temperature aluminum film 5 at a low temperature as shown in FIG. 15. As a crystal grain size of low-temperature aluminum film 31 is relatively small, it is unlikely that a recess is formed in low-temperature aluminum film 31. Recess 6 in the high-temperature aluminum film is processed to be tapered opening 7, so that a surface of low-temperature aluminum film 31 is almost planar. Accordingly, even when anti-reflection film 32 is formed on low-temperature aluminum film 31, any portion of anti-reflection film 32 would not have a smaller thickness. Therefore, low-temperature aluminum film 31 is not etched at the time of development of resist pattern 33, whereby formation of a space for the etch residue is prevented. As a result, a conductive material is left exclusively under resist pattern 33 and the other portions are substantially free of the conductive material, as shown in FIG. 12. Therefore, the semiconductor device provided with high reliability and preventing connection failure is achieved.

As high-temperature aluminum film 4 with high adhesion with other material is formed on titanium nitride film 3, semiconductor device with high reliability and preventing connection failure is achieved.

Although the embodiments of the present invention have been described above, various modifications can be made to the embodiments. For example, in the above sputtering at the high temperature has been exemplified as a method of forming high-temperature aluminum film 5. However, the method is not limited to this and, for example, a so-called high temperature reflow method may be used in which an aluminum film is formed by sputtering at a low temperature of about 100° C. and the aluminum film is kept at a high temperature of about 400° C.

Although anti-reflection film 9 has been described as having two layers of titanium and titanium nitride, a silicon nitride film may be used as the anti-reflection film. Further, though aluminum has been described as the conductive material of the interconnection layer, copper or tungsten may be employed.

In some cases, a boundary between low temperature having aluminum film 4 and high-temperature aluminum film 5 is not clearly defined. Then, a portion of low-temperature aluminum film 4 that is closer to titanium nitride film 3 has a relatively small grain size, whereas the portion closer to high temperature having aluminum film 5 has a relatively large grain size.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a conductive layer including a polycrystal on a semiconductor substrate, said conductive layer having a recess in its surface formed by a crystal grain boundary, a distance between side walls of said recess becoming large as closer to said semiconductor substrate; and processing said side walls of said recess such that the distance therebetween becomes small as closer to said semiconductor substrate.

2. The method of manufacturing the semiconductor device according to claim 1, wherein said step of forming said conductive layer includes the steps of:

forming a first conductive layer on said semiconductor substrate at a first temperature; and forming a second conductive layer having said recess on said first conductive layer at a second temperature higher than said first temperature.

3. The method of manufacturing the semiconductor device according to claim 1, further comprising the step of forming a thin film layer having a material different from that of said conductive layer on conductive layer having the processed side walls.

4. The method of manufacturing the semiconductor device according to claim 1, further comprising the step of forming an insulating layer on said semiconductor substrate and the step of forming a barrier layer on said insulating layer, said step of forming said conductive layer including the step of forming said conductive layer on said barrier layer.

5. The method of manufacturing the semiconductor device according to claim 1, wherein said step of processing said side walls includes the step of sputter etching said conductive layer.

6. A method of manufacturing a semiconductor device, comprising the steps of:

forming a first conductive layer on a semiconductor substrate at a first temperature;

forming a second conductive layer on said first conductive layer at a second temperature higher than said first temperature; and forming a third conductive layer on said second conductive layer at a third temperature lower than said second temperature; wherein said step of forming said second conductive layer includes the step of forming said second conductive layer with a recess formed in its surface by a crystal grain boundary and having side walls, a distance between said side walls becoming large as closer to said semiconductor substrate, said method further comprising the step of processing said side walls such that a distance therebetween becomes small as closer to said semiconductor substrate, and wherein said step of forming said third conductive layer includes the step of forming said third conductive layer on said second conductive layer having said processed side walls.

7. The method of manufacturing the semiconductor device according to claim 6, wherein said step of processing said side walls further includes the step of sputter etching said conductive layer.

8. The method of manufacturing the semiconductor device according to claim 6, further comprising the step of forming a thin film layer having a material different from that of said third conductive layer on said third conductive layer.

9. The method of manufacturing the semiconductor device according to claim 6, further comprising the step of forming an insulating layer on said semiconductor substrate and the step of forming a barrier layer on said first insulating layer, said step of forming said conductive layer including the step of forming said first conductive layer on said barrier layer.

* * * * *